United States Patent
US 9,852,247 B2
Yao et al.
(45) Date of Patent: Dec. 26, 2017

(54) AREA-EFFICIENT MEMORY MAPPING TECHNIQUES FOR PROGRAMMABLE LOGIC DEVICES

(71) Applicant: Lattice Semiconductor Corporation, Hillsboro, OR (US)

(72) Inventors: Peng Yao, Fremont, CA (US); Venkat Rajappan, Fremont, CA (US); Sreepada Hegade, Los Gatos, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 229 days.

(21) Appl. No.: 14/713,991

(22) Filed: May 15, 2015

(65) Prior Publication Data

US 2016/0335383 A1 Nov. 17, 2016

(51) Int. Cl.
*G06F 17/50* (2006.01)

(52) U.S. Cl.
CPC ...... *G06F 17/5054* (2013.01); *G06F 17/5045* (2013.01)

(58) Field of Classification Search
None
See application file for complete search history.

(56) References Cited

U.S. PATENT DOCUMENTS

| | | | | |
|---|---|---|---|---|
| 5,844,854 A | * | 12/1998 | Lee | G11C 8/00 365/230.01 |
| 6,919,736 B1 | * | 7/2005 | Agrawal | G06F 17/5054 326/38 |
| 6,966,044 B2 | * | 11/2005 | Reuland | G06F 17/5045 716/117 |
| 6,975,137 B1 | * | 12/2005 | Schadt | H03K 19/17732 326/39 |
| 7,257,799 B2 | * | 8/2007 | McKenney | G06F 17/5045 716/117 |

(Continued)

OTHER PUBLICATIONS

D.P. Mehta et al., "Corner Stitching for Simple Rectilinear Shapes," IEEE Trans. on CAD of ICs & Systems, vol. 16, No. 2, Feb. 1997, pp. 186-198.*

(Continued)

*Primary Examiner* — Leigh Garbowski
(74) *Attorney, Agent, or Firm* — Hayne and Boone, LLP

(57) ABSTRACT

Various techniques are provided to implement a logical memory in programmable logic devices (PLDs) having embedded block RAMs (EBRs). For example, a computer-implemented method includes determining a main area of a logical memory that can be fully mapped to a first one or more EBRs configured in a first depth-width configuration, mapping the main area to the first one or more EBRs, and mapping the remainder of the logical memory to a second one or more EBRs configured in a second or more depth-width configurations. The mapping of the remainder of the logical memory may be performed hierarchically by a recursive process, in some embodiments. The depth-width configurations and the corresponding mapping may be selected according to an efficiency metric, for example. Other embodiments include a system comprising a PLD and a configuration memory storing configuration data generated by such a method, and a PLD configured with such configuration data.

20 Claims, 11 Drawing Sheets

(56) References Cited

U.S. PATENT DOCUMENTS

| | | | |
|---|---|---|---|
| 7,444,613 B1* | 10/2008 | Chiu | G06F 17/5054 |
| | | | 716/104 |
| 7,493,585 B1 | 2/2009 | Ahmed et al. | |
| 7,797,666 B1* | 9/2010 | Chiu | G06F 17/5054 |
| | | | 716/116 |
| 7,877,555 B1* | 1/2011 | Tessier | G11C 5/14 |
| | | | 711/154 |
| 9,330,733 B1* | 5/2016 | Tessier | G11C 5/14 |
| 9,507,530 B2* | 11/2016 | Seo | G06F 3/0611 |
| 2016/0004636 A1* | 1/2016 | Yang | G06F 12/0895 |
| | | | 711/118 |

OTHER PUBLICATIONS

W.K.C. Ho et al., "Logical-to-Physical Memory Mapping for FPGAs with Dual-Port Embedded Arrays," Proc. of the Int'l Workshop of Field Programmable Logic and Applications, Aug. 1999, pp. 111-123.*

Russell Tessier et al., Power-aware RAM Mapping for FPGA Embedded Memory Blocks, FPGA Proceedings of the 2006 ACM/SIGDA 14th International Symposium on Field Programmable Gate Arrays, Feb. 22, 2006, pp. 189-198, Monterey, California, US.

S. Muthukrishnan et al., On Rectangular Partitionings in Two Dimensions: Algorithms, Complexity, and Applications, Jan. 10-12, 1999, ICDT Proceedings of the 7th International Conference on Database Theory, pp. 236-256, Jerusalem, Israel.

* cited by examiner

AREA-EFFICIENT MEMORY MAPPING TECHNIQUES FOR PROGRAMMABLE LOGIC DEVICES

TECHNICAL FIELD

The present invention relates generally to programmable logic devices and, more particularly, to implementing user-defined memories in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded memories, embedded hardware, or other types of resources) and interconnections available in particular PLDs. Physical placement and routing for the synthesized and mapped user designs may then be determined to generate configuration data for the particular PLDs.

Many PLDs today include dedicated memory resources to facilitate efficient implementation of memory components such as random access memories (RAMs), read only memories (ROMs), and first-in first-out (FIFO) memories as may be needed in the user designs. Such dedicated memory resources, also referred to as embedded block RAMs (EBRs) or embedded memory blocks, are typically embedded in PLDs as one or more blocks of static RAM (SRAM), dynamic RAM (DRAM), and/or flash memory that can be configured together with other configurable resources of PLDs to implement memory components having desired functionalities.

For example, EBRs provided in some PLD implementations can be configured in one of a plurality of memory depth-width configurations available for EBRs. A user-specified memory (also referred to as a logical memory) in a user design may be mapped to and implemented by a plurality of EBRs if the user-specified memory does not fit within one EBR due to the size and available depth-width configurations of EBRs. However, the mapping of a user-specified memory to a plurality of EBRs by conventional memory mapping techniques may undesirably result in inefficient utilization of EBRs, for example, requiring more EBRs than it may be necessary and leaving unutilized portions in EBRs.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with various embodiments set forth herein, techniques are provided to implement user-specified memory components (e.g., logical memories) by programmable logic devices (PLDs) having embedded block RAMS (EBRs). In particular, according to various embodiments of the disclosure, a logical memory in a design for a PLD may be mapped to EBRs to implement the logical memory in an area-efficient manner, such that the PLD configured with the design may require less EBRs and/or less of other PLD resources to implement the logical memory than would be possible with conventional mapping techniques. For example, improved logical memory mapping techniques according to one or more embodiments of the disclosure may include dividing a logical memory into a main area and a subarea (e.g., the remainder of the logical memory, excluding the main area) in a hierarchical manner for a more flexible and area-efficient mapping of the logical memory onto EBRs configured in a combination of different depth-width configurations, as opposed to treating the logical memory as one flat, monolithic area.

In one or more embodiments, a computer-implemented method includes determining a main area of a logical memory that can be fully mapped to a first one or more EBRs configured in a first depth-width configuration, mapping the main area to the first one or more EBRs, and mapping the remainder of the logical memory to a second one or more EBRs configured in a second or more depth-width configurations. The mapping of the remainder of the logical memory may be performed hierarchically by a recursive process in some embodiments. The depth-width configurations and the corresponding mapping may be selected according to an efficiency metric, such as a memory area efficiency metric that is indicative of the aggregate size of the EBRs and other PLD resources that may be consumed to implement the logical memory. In some embodiments, the computer-implemented method may further include determining whether the mapping of the logical memory would lead to unbalanced utilization of EBRs and other PLD resources, and rebalancing if needed by replacing one or more EBRs in the mapping with other PLD components such as programmable logic blocks (PLBs) configured as memories.

Embodiments of the disclosure may also include a computer-readable medium storing instructions that cause a computer system to perform such a method, a computer system configured to perform such a method, a system comprising a PLD and a configuration memory storing configuration data including the logical memory mapping generated according to such a method, a computer-readable medium storing configuration data including the logical memory mapping generated according to such a method, and a PLD configured with such configuration data.

Figure 1:
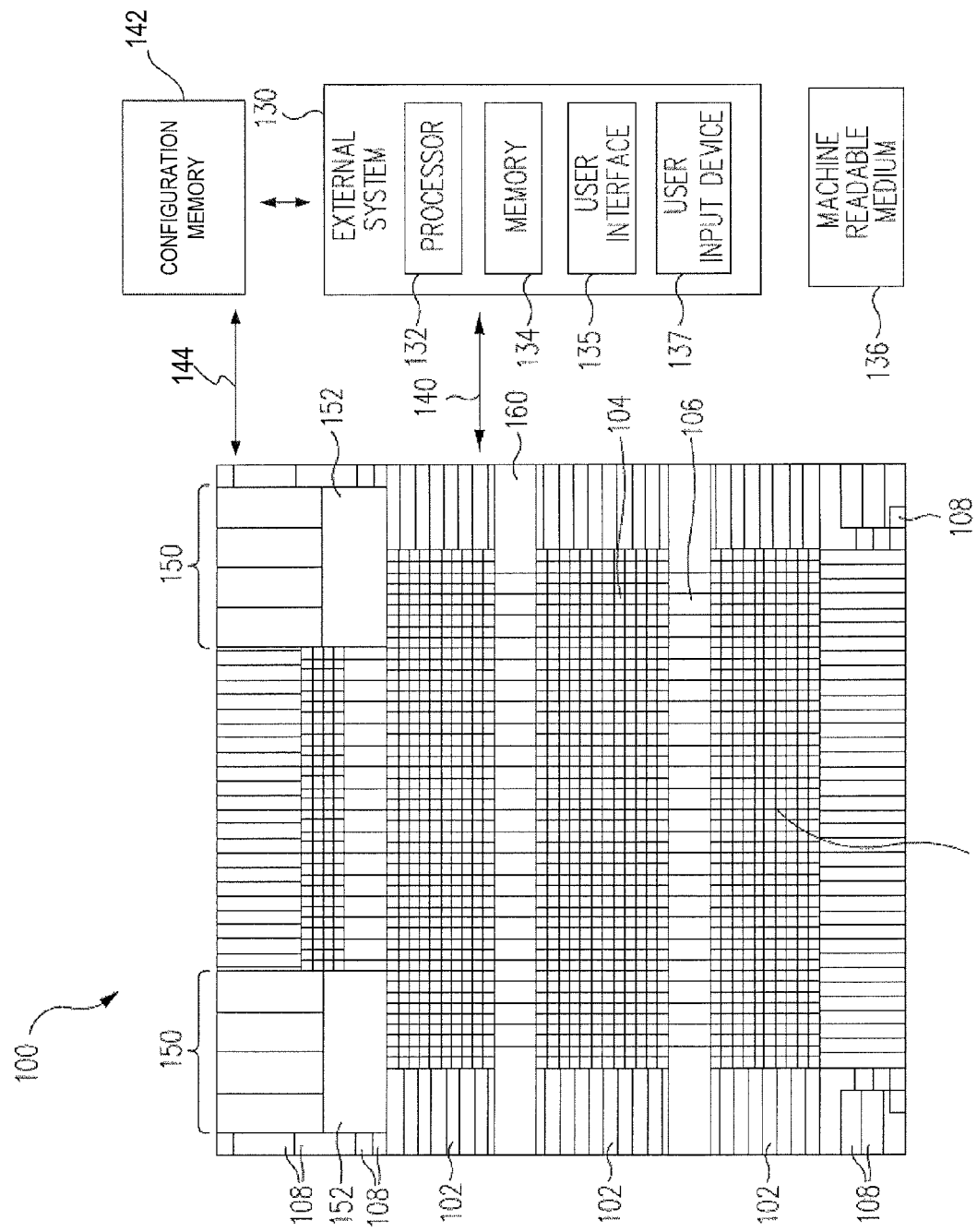
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. In various embodiments, PLD 100 may be implemented as a standalone device, for example, or may be embedded within a system on a chip (SOC), other logic devices, and/or other integrated circuit(s). PLD 100 (e.g., a field programmable gate array (FPGA)), a complex programmable logic device (CPLD), a field programmable system on a chip (FPSC), or other type of programmable device) generally includes input/output (I/O) blocks 102 and programmable logic blocks (PLBs) 104 (e.g., also referred to as logic blocks, programmable functional units (PFUs), or programmable logic cells (PLCs)).

PLBs 104 provide logic functionality (e.g., LUT-based logic or logic gate array-based logic) for PLD 100. In one or more embodiments, PLBs 104 may also provide memory functionality, for example, by LUTs configured to be utilized as memory cells. I/O blocks 102 provide I/O functionality (e.g., to support one or more I/O and/or memory interface standards) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than PLBs 104).

PLD 100 may also include a plurality of embedded block RAMs (EBRs) 106 (e.g., blocks of SRAM, DRAM, EEPROM, flash memory, and/or other memory devices), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, EBRs 106, also referred to as embedded memory blocks 106, may be used for implementing memory components such as RAMs, ROMs, FIFO memories, or other memory components having desired functionalities. In this regard, each EBR 106 may be configurable with respect to its memory depth (e.g., the number of addressable locations or memory lines) and width (e.g., the number of output bits per location) according to a predefined set of memory depth and width configurations. For example, each EBR 106 may be configured in one of the predefined set of configurations to implement all or part of a user-specified memory component having a certain depth and width. In some embodiments, all EBRs 106 may be of a same size, whereas in other embodiments EBRs 106 may be provided in two or more different sizes. A suitable number of EBRs 106 may be provided depending on the desired application of PLD 100.

Certain I/O blocks 102 may be used for EBRs 106 or transferring information (e.g., various types of user data and/or control signals) to/from PLD. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or PLBs 104 as appropriate.

Configuration data, which is to be received via I/O block 102 or otherwise received by (e.g., loaded onto) PLD 100 for configuring PLD 100, may be stored in a configuration memory 142 in some embodiments. Configuration memory 142 may comprise one or more non-volatile memory devices, such as a flash memory, EPROM, EEPROM, or hard disk drive, adapted to store and provide all or part of the configuration data for PLD 100 when PLD 100 is powered on, initialized, in a configuration mode, or otherwise being configured with the configuration data. In the embodiment illustrated by FIG. 1, configuration memory 142 is external and communicatively coupled to PLD 100 (e.g., configured to communicate over one or more connections 144). In another embodiment, configuration memory 142 may be implemented as part of (e.g., embedded within) PLD 100. In yet another embodiment, configuration memory 142 may be distributed internally and externally, such that one or more non-volatile memory devices of configuration memory 142 may be embedded within PLD 100 while one or more other non-volatile memory devices of configuration memory 142 may be externally provided.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between PLBs 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may store such configuration data to memory 134 and/or machine readable medium 136, and/or provide such configuration data to one or more I/O blocks 102, EBRs 106, SERDES blocks 150, and/or other portions of PLD 100, directly or via configuration memory 142. As a result, EBRs 106, PLBs 104, routing resources 180, and any other appropriate components of PLD 100 may be configured to operate in accordance with user-specified applications, for example when configured with configuration data that is generated by external system 130 and stored in configuration memory 142.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond™ System software available from Lattice Semiconductor Corporation, to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
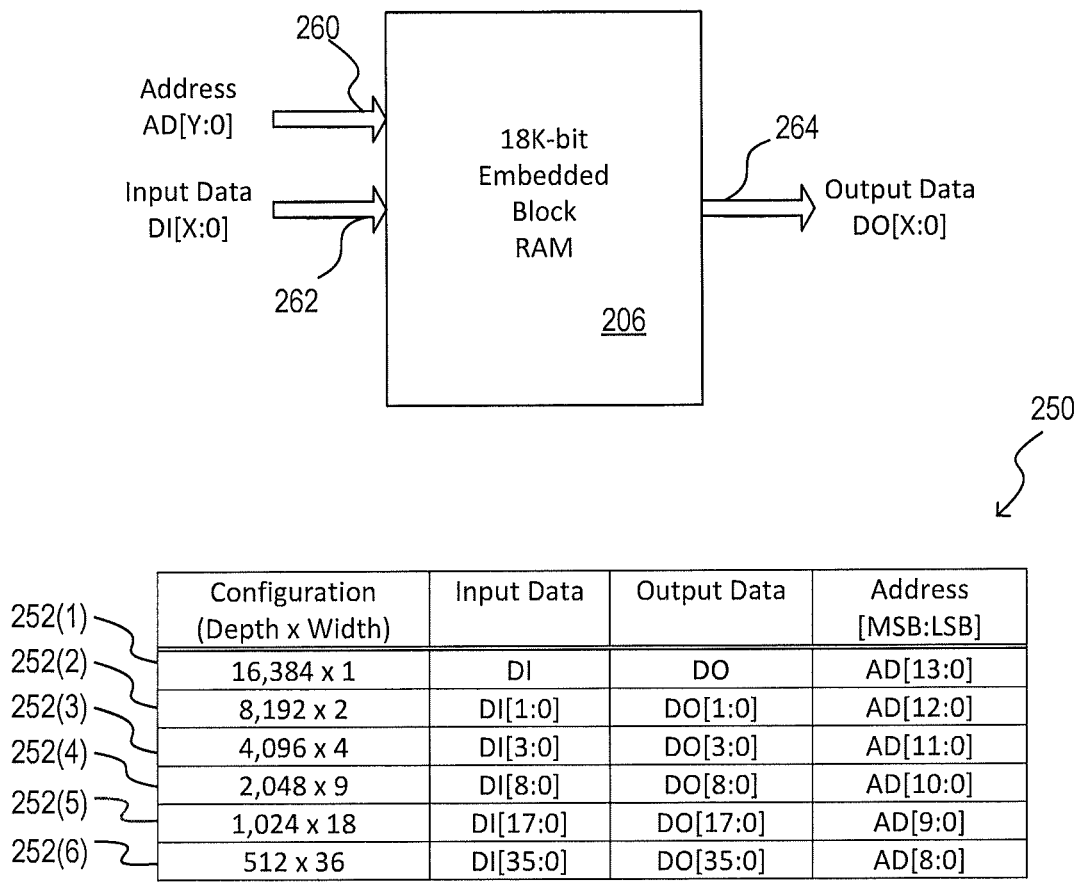
FIG. 2 illustrates a block diagram of an embedded block RAM (EBR) of a PLD in accordance with an embodiment of the disclosure.

FIG. 2 illustrates a block diagram of an EBR 206, such as EBR 106 of PLD 100, in accordance with an embodiment of the disclosure. As discussed, PLD 100 includes a plurality of EBRs 106/206 to facilitate implementation of memory components as desired in particular designs for PLD 100.

In the particular example of FIG. 2, EBR 206 is shown to have a size of 18K bits (18,432 bits), but EBR 106/206 may be provided in other sizes as desired for particular implementations of PLD 100. In various embodiments, EBR 206 is configurable according to an EBR configuration for utilizing the 18K bits of memory space in a particular fashion to implement memory components as desired for particular user designs. In one aspect, EBR 206 may be configurable with respect to its memory depth and width. For example, EBR 206 may be configured in one of a set of memory depth and width configurations associated with EBR 206, so as to utilize the 18K bits of memory space in a particular one of the combinations of the number of addressable locations (e.g., the depth) and the number of output bits per locations (e.g., the width).

An example set of EBR configurations (including EBR depth-width configurations) associated with the example EBR 206 are illustrated as a table 250 in FIG. 2. In this particular example, EBR 206 may be configured in one of six EBR configurations 252(1) through 252(6) to utilize the 18K bits of memory space. For example, EBR 206 may be configured to provide a 1-bit output for 16K (16,384) addressable locations as provided in EBR configuration 252(1), a 36-bit output for 512 addressable locations as provided in EBR configuration 252(6), or otherwise as provided in other available EBR configurations 252(2) through 252(5). In other implementations according to embodiments of the disclosure, EBR 106/206 may provide other suitable number of available depth-width configurations.

In this regard, according to one or more embodiments, EBR 206 may include an address port 260 (labeled AD[Y:0] in FIG. 2 to indicate its width of 0 to Y-th bit), an input data port 262 (labeled DI[X:0] to indicate its width of 0 to X-th bit), and an output data port 264 (labeled DO[X:0] to indicate its width of 0 to X-th bit), whose widths may vary as shown in table 250 to configure EBR 206 in one of the six EBR configurations (e.g., depth-width configurations) 252 (1) through 252(6). EBR 206 may also include other ports, such as one or more control signal ports to receive control signals (e.g., read and write enable signals, clock signals, reset signals), one or more memory cascading selection ports (e.g., including an address decoder for selecting from among two or more EBRs 106/206 that are cascaded) for combining two or more EBRs 106/206 to implement a user-defined memory component, additional address and data ports, and other suitable ports. Such other ports (not shown in FIG. 2 to enhance clarity) may be configured and utilized according to other aspects of an EBR configuration.

Therefore, all or part of a user-defined memory component in a user design may be implemented in PLD 100 by one or more EBRs 106/206 configured in one of the available EBR configurations. For example, as further discussed herein, a user-defined memory component that is larger than any one of EBRs 106/206 may be sliced and mapped onto a plurality of EBRs 106/206 configured in different EBR configurations to utilize EBR 106/206 in an efficient manner, according to one or more embodiments of the disclosure.

Figure 3:
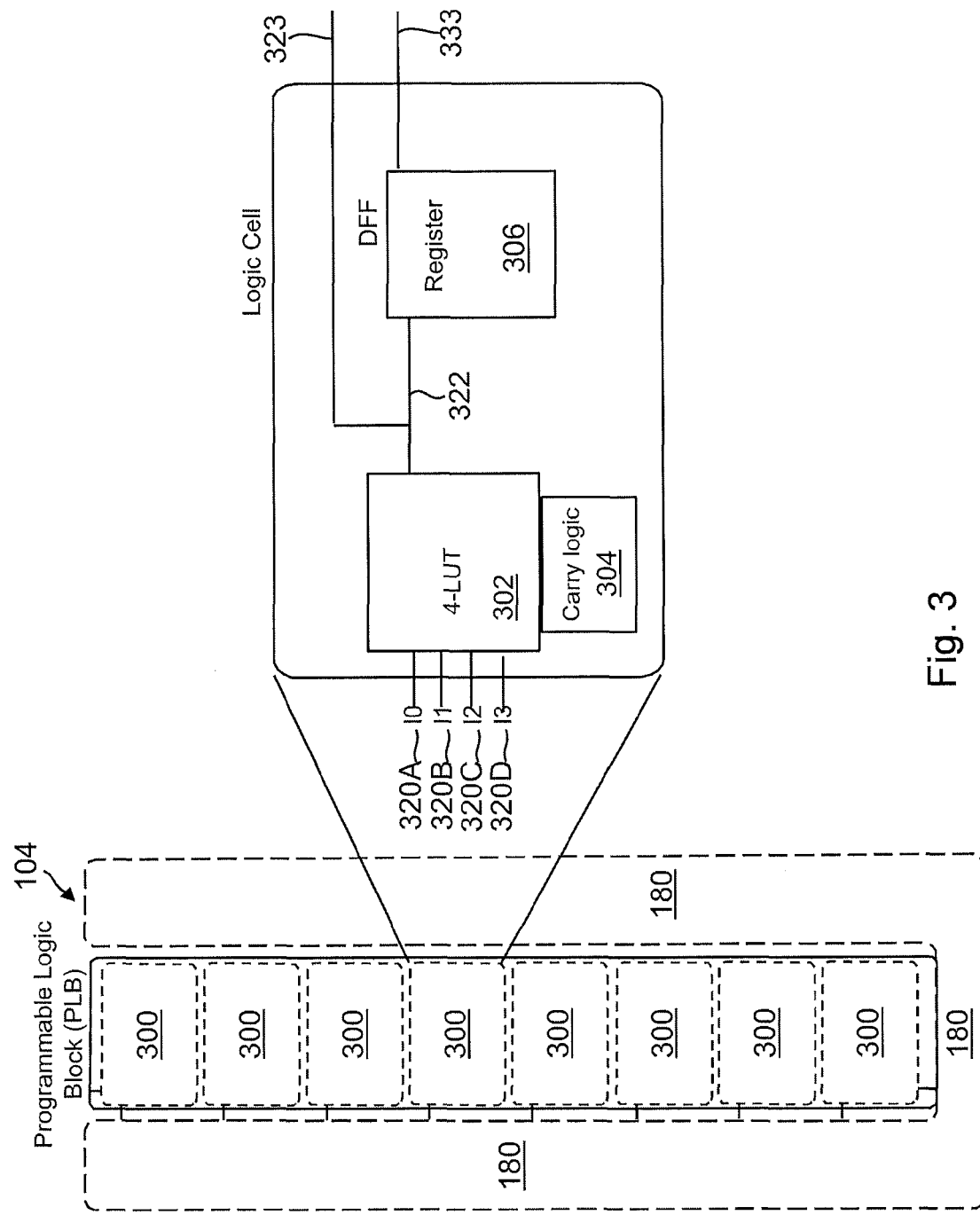
FIG. 3 illustrates a block diagram of a programmable logic block (PLB) of a PLD in accordance with an embodiment of the disclosure.

FIG. 3 illustrates a block diagram of a PLB 104 of PLD 100 in accordance with an embodiment of the disclosure. As discussed, PLD 100 includes a plurality of PLBs 104 including various components to provide logic, arithmetic, or memory functionality depending on configuration.

In the example embodiment shown in FIG. 3, PLB 104 includes a plurality of logic cells 300, which may be interconnected internally within PLB 104 and/or externally using routing resources 180. For example, each logic cell 300 may include various components such as a lookup table (LUT) 302, a register 306 (e.g., a flip-flop or latch), and various programmable multiplexers for selecting desired signal paths for logic cell 300 and/or between logic cells 300. In this example, LUT 302 accepts four inputs 320A-320D, which makes it a four-input LUT (which may be abbreviated as "4-LUT" or "LUT4") that can be programmed by configuration data for PLD 100 to implement any appropriate logic operation having four inputs or less (e.g., to provide 16 different values as its logic outputs based on the four logic inputs). LUT 302 in other examples may be of any other suitable size having any other suitable number of inputs for a particular implementation of PLD 100. In some embodiments, different size LUTs may be provided for different PLBs 104 and/or different logic cells 300. An output signal 322 from LUT 302 may in some embodiments be passed through register 306 to provide an output signal 333 of logic cell 300. In various embodiments, an output signal 323 from LUT 302 may be passed to output 323 directly, as shown.

In some embodiments, PLB 104 may be configurable to function as an arithmetic component such as adders, subtractors, comparators, counters, or other arithmetic components. In such embodiments, logic cell 300 may also include carry logic 304 for efficient implementation of arithmetic functionality. In some embodiments, PLB 104 may be configurable to function as a memory component such as a RAM, ROM, FIFO memory, or other memory component. In such embodiments, PLB 104 may be configurable to utilize one or more LUTs 302 each as a memory providing a one-bit output (e.g., a 16×1 bit memory by a 4-LUT), and utilize one or more other LUTs 302 as memory addressing and control logic to implement a memory component of a desired functionality and size with the one or more LUTs 302 each providing a one-bit memory. In this regard, PLB 104 configured as a memory component may also be referred to as a distributed memory or distributed RAM.

Therefore, all or part of a user-defined memory component in a user design may be implemented in PLD 100 by one or more PLBs 104 configured as a distributed memory, in addition to or in place of one or more EBRs 106/206. For example, as further discussed herein, a portion of a user-defined memory component that is mapped to one or more EBRs 106/206 may be replaced with PLBs 104 configured as a distributed memory to balance the utilization of EBRs 106/206 and PLBs 104 in PLD 100 implementing the user design, according to one or more embodiments of the disclosure.

Figures 4A, 4B:
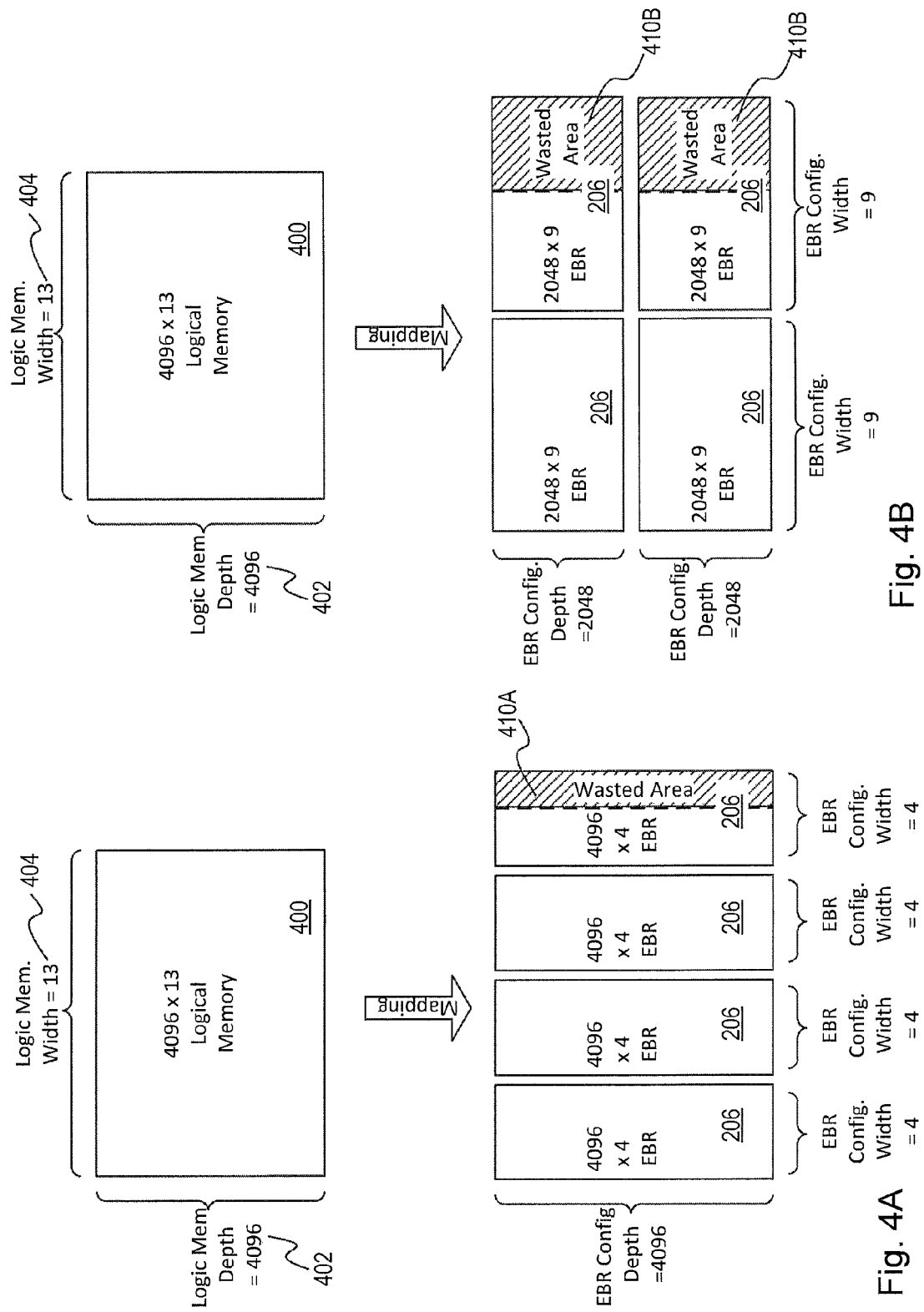
FIGS. 4A and 4B illustrate an example of a logical memory in accordance with an embodiment of the disclosure.

FIGS. 4A and 4B illustrate an example of a user-defined memory component 400 in accordance with an embodiment of the disclosure. User-defined memory component 400, also referred as logical memory 400, may be synthesized from hardware description language (HDL) code, specified in a register transfer level (RTL) description, generated from a module generator (e.g., parameterizable modules, libraries, templates and/or schematics), or otherwise specified as part of a user design to be implemented in PLDs 100. For example, logical memory 400 may represent a random access memory (RAM), first-in first-out memory (FIFO), shift registers, or other types of memory to be implemented by PLD resources as part of a user design.

Logical memory 400 may be described in terms of its depth 402 (e.g., the number of addressable locations or memory lines) and width 404 (e.g., the number of output bits per location), similar to the description of the various configurations of EBR 206 in terms of its depth and width. If logical memory 400 does not fit within one EBR 206, such as when depth 402 of logical memory 400 exceeds all EBR depth configurations, when width 404 of logical memory 400 exceeds all EBR width configurations, or both, logical memory 400 may be sliced (e.g., partitioned) so that logical memory 400 can be mapped and implemented on two or more EBRs as needed.

In the non-limiting example illustrated for FIGS. 4A and 4B, logical memory 400 in the user design is specified to have depth 402 of 4096 memory lines and width 404 of 13 bits (a 4096×13 logical memory), which would not fit within any configuration of the example EBR 206 illustrated above for FIG. 2, and thus would need to be sliced and mapped onto multiple EBRs 206. In this regard, logical memory 400 may be sliced horizontally into multiple rows of EBRs 206 each mapped to a portion of the logical memory depth 402, sliced vertically into multiple columns of EBRs 206 each mapped to a portion of the logical memory width 404, or sliced both horizontally and vertically.

For example, a 4096×13 logical memory 400 can be vertically sliced and mapped to four columns of EBRs 206 in a 4096×4 configuration, as shown in FIG. 4A. For another example, a 4096×13 logical memory 400 can be horizontally and vertically sliced and mapped into two rows by two columns of EBRs 206 in a 2048×9 configuration, as shown in FIG. 4B. With horizontal slicing, additional logic functions (e.g., implemented in PLBs 104) may be needed to implement address decoding and output multiplexing for the logical memory address space that is spread over multiple rows of EBRs. With vertical slicing, while additional address decoding and output multiplexing is not required, power consumption may increase due to multiple columns of EBRs being enabled at the same time to access an entire memory line.

The slicing and mapping examples illustrated by FIGS. 4A and 4B respectively utilize a certain depth-width configuration for all mapped EBRs 206 (a 4096×4 configuration for FIG. 4A and a 2048×9 configuration for FIG. 4B), and may be a result of typical conventional slicing and mapping techniques which may, for example, operate to balance the costs (e.g., additional logic versus increased power consumption) of horizontal slicing and vertical slicing. However, logical memory slicing and mapping according to conventional techniques may undesirably leave wasted areas 410A (e.g., the 4096×3 area left unutilized since only a 13-bit width is used out of the 16-bit width provided by the four columns of EBRs 206) and 410B (e.g., two 2048×5 are left unutilized since only a 13-bit width is used out of the 18-bit width provided by the two columns of EBRs 206).

As further described herein, improved logical memory slicing and mapping techniques according to various embodiments of the disclosure may reduce or even eliminate such wasted areas 410A and 410B that would result from using conventional techniques. Such improved logical memory slicing and mapping techniques in accordance with embodiments of the disclosure are further discussed with reference to FIGS. 5A-5C, 6A-6B, and 7.

Figures 5A, 5B:
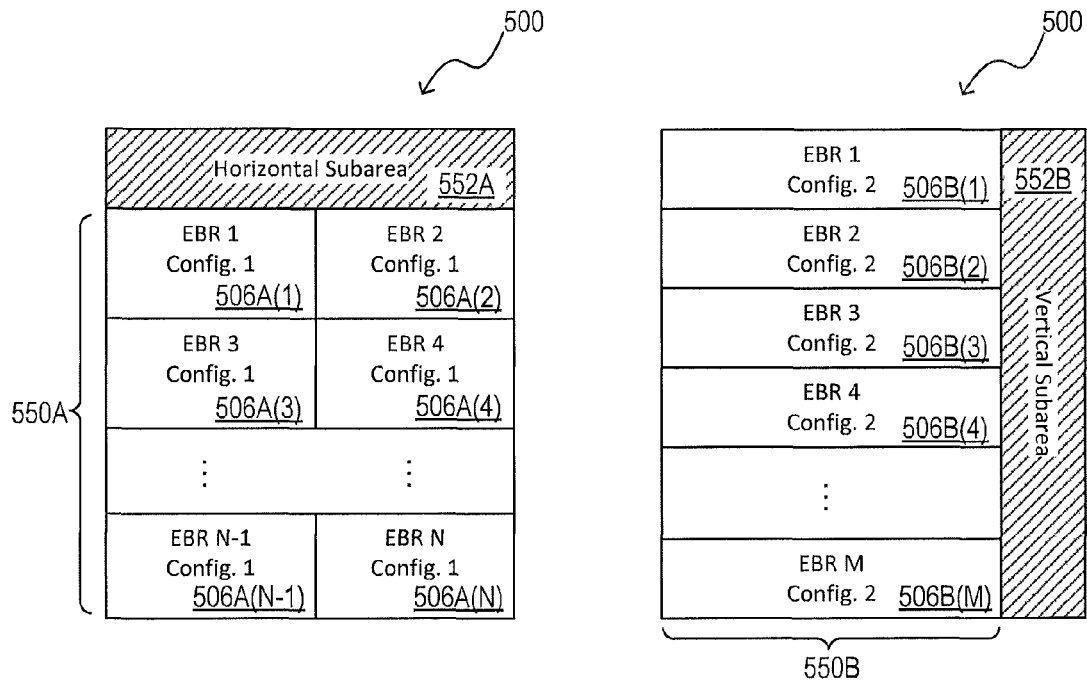
FIGS. 5A through 5C illustrate slicing and mapping of a logical memory in accordance with an embodiment of the disclosure.
Figure 5C:
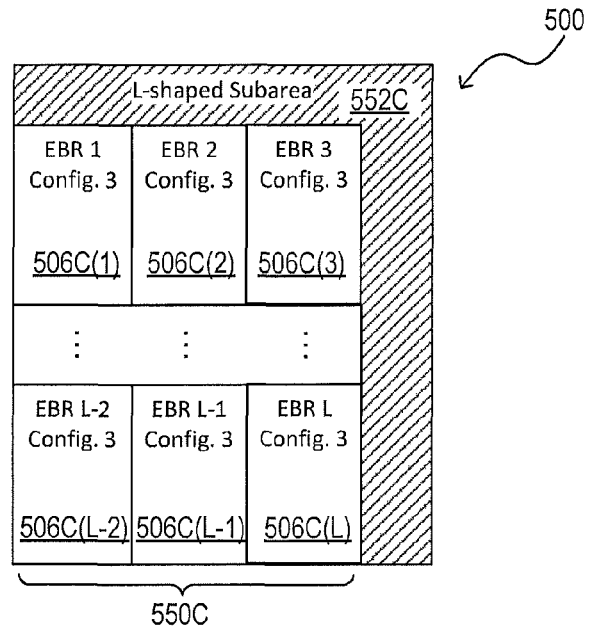

In particular, FIGS. 5A-5C illustrate a logical memory 500 divided into a main area 550A/550B/550C and a subarea 552A/552B/552C for slicing and mapping of logical memory 500 in accordance with an embodiment of the disclosure. Main area 550A/550B/550C refers to a portion of logical memory 500 that can be fully mapped to whole EBRs configured in a selected EBR configuration. In other words, in main area 550A/550B/550C, the entire depth and width of all EBRs in a particular depth-width configuration can be utilized to implement a corresponding portion of logical memory 500 without leaving an unutilized portion in the EBRs.

For example, main area 550A in FIG. 5A corresponds to a portion of logical memory 500 where whole EBRs 506A(1) through 506A(N) in a selected EBR configuration (labeled "Config. 1" in FIG. 5A) would fit if mapped. That is, main area 550A corresponds to a portion that can be fully mapped to EBRs 506A(1) through 506(N) (e.g., EBRs 106/206 configured in "Config. 1"). The remaining portion, where EBRs configured for "Config. 1" would not be wholly utilized if mapped, is identified as subarea 552A. For another EBR configuration (labeled "Config. 2") shown in FIG. 5B, main area 550B would be determined (e.g., formed) by fitting the depths and widths of whole EBRs 506B(1) through 506B(M) (e.g., EBRs 106/206 configured in "Config. 2"), whereas the remaining area would be subarea 552B in which EBRs in "Config. 2" would not wholly fit. For yet another configuration (labeled "Config. 3") shown in FIG. 5C, main area 550C would be determined or formed by fitting the depths and widths of whole EBRs 506C(1) through 506C(L) (e.g., EBRs 106/206 configured in "Config. 3"), whereas the remaining area would be subarea 552C in which EBRs in "Config. 3" would not wholly fit.

In case main area 550A extends over the entire width of logical memory 500 but not the depth as shown in the example case of FIG. 5A, corresponding subarea 552A is a rectangular area covering the remaining depth of logical memory 500. Such a subarea (e.g., subarea 552A) may be referred to as a horizontal subarea. In case main area 550B extends over the entire depth of logical memory 500 but not the width, corresponding subarea 552B is a rectangular area covering the remaining width of logical memory 500 and may be referred to as a vertical subarea 552B as shown in FIG. 5B. In case main area 550C covers neither the entire depth nor the entire width of logical memory 500, subarea 552C correspondingly takes an L-shaped form and may be referred to as an L-shaped subarea 552C as shown in FIG. 5C. Note the terms "horizontal," "vertical," "row," "column," and "L-shaped" are used herein for purposes of illustration, and thus are not intended to be limiting as to any specific direction or orientation.

In the hierarchical slicing and mapping techniques according to embodiments of the disclosure, the determination of a main area and a corresponding subarea of logical memory 500 may be repeated for a number of different EBR configurations. For example, the determination of a main area and a corresponding subarea may be tried for all EBR configurations available for EBR 106/206, or some selected ones (e.g., skipping or short-circuiting one or more particular EBR configurations that do not need to be tried) of all available EBR configurations for EBR 106/206. Thus, for any one of the different EBR configurations being tried, one of the three types of subareas 552A, 552B, and 552C may be encountered, unless there is no main area because no whole EBR can be fitted into logical memory 500 for the particular EBR configuration or there is no subarea because the entire logical memory 500 is wholly divisible by the particular EBR configuration.

The subarea (e.g., subarea 552A/552B/552C) determined for the particular EBR configuration is then effectively treated as one or two dependent logical memories to be sliced and mapped. As discussed above, a horizontal subarea (e.g., subarea 552A) and a vertical subarea (e.g., subarea 552B) are rectangular portions of a logical memory, and as such, they can be sliced and mapped in a same manner as logical memories having the depth and width of the respective subareas. With respect to an L-shaped subarea (e.g., subarea 552C), such a subarea may be divided into two subareas, which can then be treated as two logical memories each having a respective depth and width, according to one or more embodiments of the disclosure.

Figure 6B:
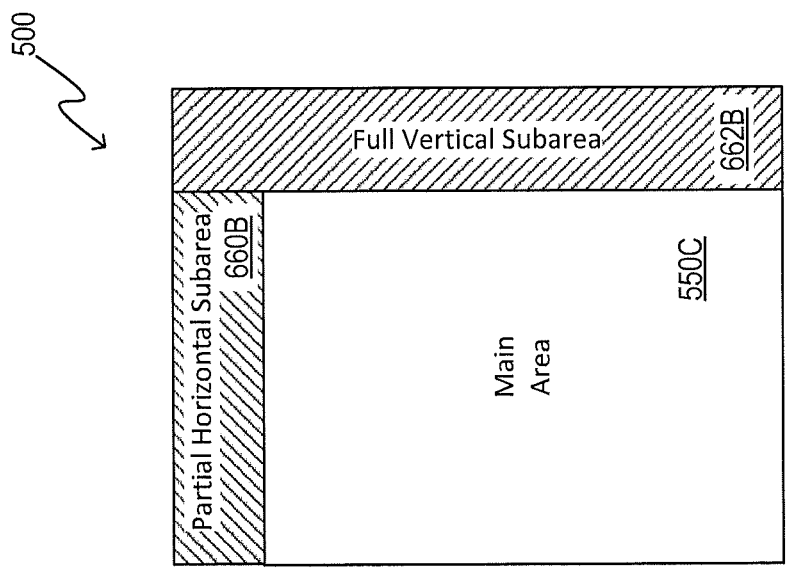
FIGS. 6A and 6B illustrate various ways in which an L-shaped subarea of a logical memory may be divided in accordance with an embodiment of the disclosure.
Figure 6A:
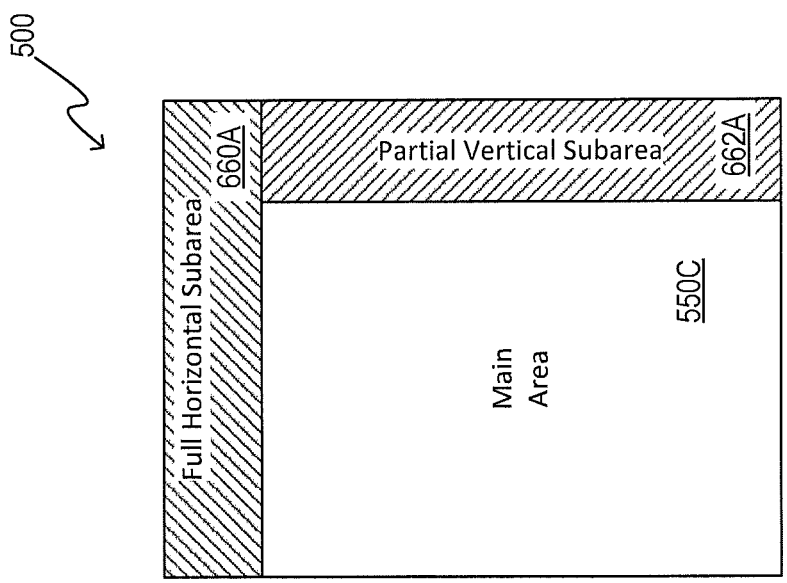

FIGS. 6A and 6B illustrate two ways in which an L-shaped subarea (e.g., subarea 552C) may be divided, in accordance with an embodiment of the disclosure. In FIG. 6A, the L-shaped subarea is divided into a full horizontal subarea 660A that extends over the entire width of logical memory 500 and a partial vertical subarea 662A that has the same depth as main area 550C. In FIG. 6B, the L-shaped subarea is divided into a partial horizontal subarea 660B that has the same width as main area 550C and a full vertical subarea 662B that extends over the entire depth of logical memory 500. In some embodiments, the hierarchical slicing and mapping techniques of the disclosure may try and compare both cases of division to find more efficient mapping of the L-shaped subarea.

Logical memory 500 may thus be divided into main area 550A/550B/550C and subarea 552A/552B/552C, where subarea 552A/552B/552C may comprise a horizontal subarea (subarea 552A), a vertical subarea (subarea 552B), or both (subarea 552C comprising horizontal subarea 660A/660B and vertical subarea 662A/662B) that are sliced again for all the different EBR configurations in the same manner as logical memory 500. This may in turn divide horizontal subarea 552A/660A/660B and/or vertical subarea 552B/662A/662B into their own main area and subarea for all the different EBR configurations, continuing in the same fashion until there is no main area or subarea. In this regard, the slicing according to one or more embodiments continues hierarchically, with the subarea in each level of the hierarchy being one or more logical memories that are dependent from (e.g., a child of) the logical memory in a one level above. Thus, for example, such hierarchical slicing according to one or more embodiments may be understood or represented as a binary tree structure where each node has a horizontal subarea as one child and/or a vertical subarea as the other child, with logical memory 500 being the root.

From among the different EBR configurations tried for logical memory 500, including the different EBR configurations tried for the horizontal and/or vertical subareas in the hierarchy, a certain hierarchical combination of EBR configurations may be selected for slicing and mapping logical memory 500 according to one or more criteria. In various embodiments, the one or more criteria include a criterion relating to PLD resource requirement in implementing logical memory 500 in PLD 100. For example, in some embodiments, the one or more criteria may include a memory area efficiency metric, which may be determined based at least in part on how many EBRs 106/206 are required to implement logical memory 500 of a given size as further described herein. In such embodiments, the hierarchical combination of EBR configurations that is selected for slicing and mapping logical memory 500 may require the least amount of PLD resources (e.g., including EBRs 106/206) to implement logical memory 500 in a particular PLD.

Figure 7:
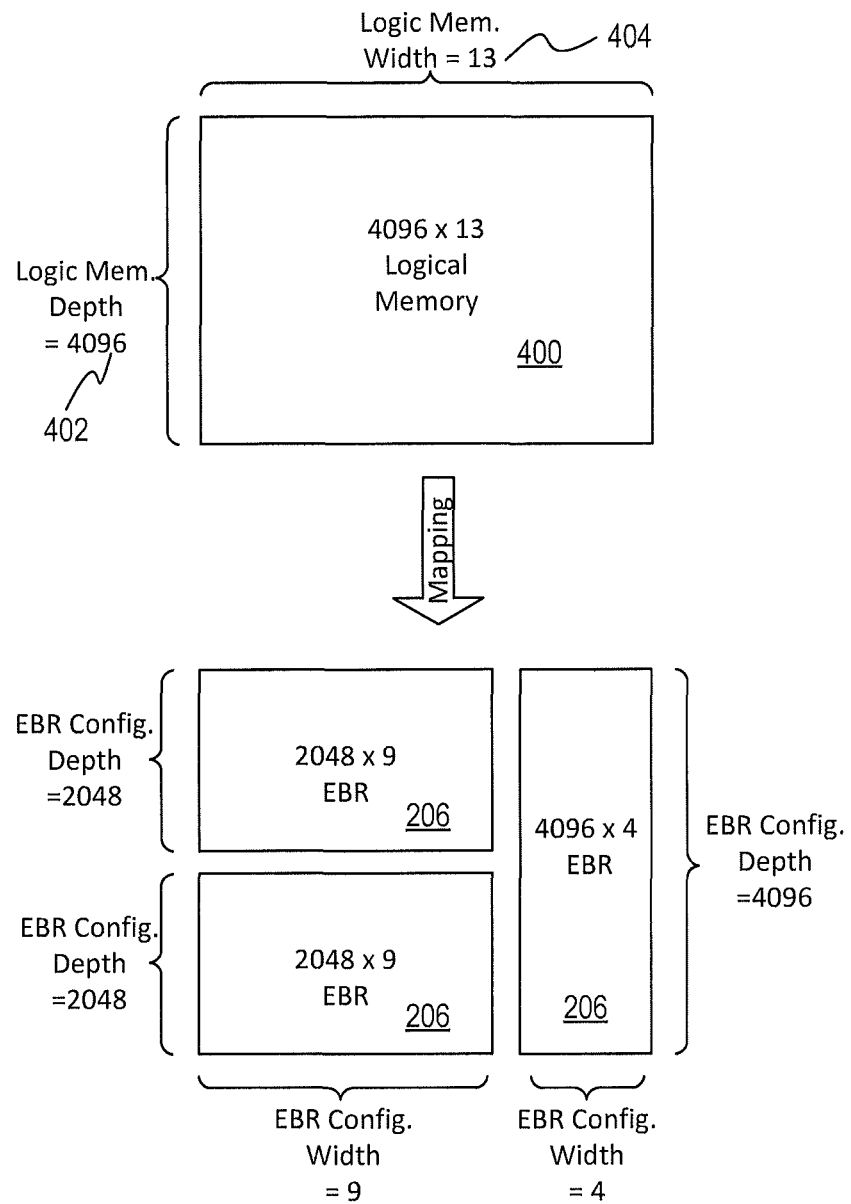
FIG. 7 illustrates an example result of mapping the logical memory of FIG. 4 to EBRs in accordance with an embodiment of the disclosure.

For example, FIG. 7 illustrates an example result of the logical memory slicing and mapping techniques discussed above in accordance with embodiments of the disclosure. As shown, the example 4096×13 logical memory 400 of FIG. 4 may be mapped to just three EBRs 206, two in the 2048×9 configuration and one in the 4096×4 configuration from the available configurations of the example EBR 206. The two 2048×9 EBRs 206 may for example correspond to a main area (e.g., main area 550B) and the one 4096×13 EBR 206 may for example correspond to a vertical subarea (e.g., subarea 552B) that in effect defines a dependent logical memory mapped by a hierarchical application of the slicing techniques as discussed above for one or more embodiments. Compared with the example slicing and mapping results according to conventional techniques as shown in FIGS. 4A and 4B, the example result of the logical memory slicing and mapping techniques according to one or more embodiments of the disclosure uses less EBRs 206 and leaves no wasted areas such as wasted areas 410A and 410B. As may be appreciated, the resulting mapping of the logical memory slicing and mapping techniques according to embodiments of the disclosure may be different depending on what configurations are available for EBRs 106/206 of PLD 100.

Figure 8:
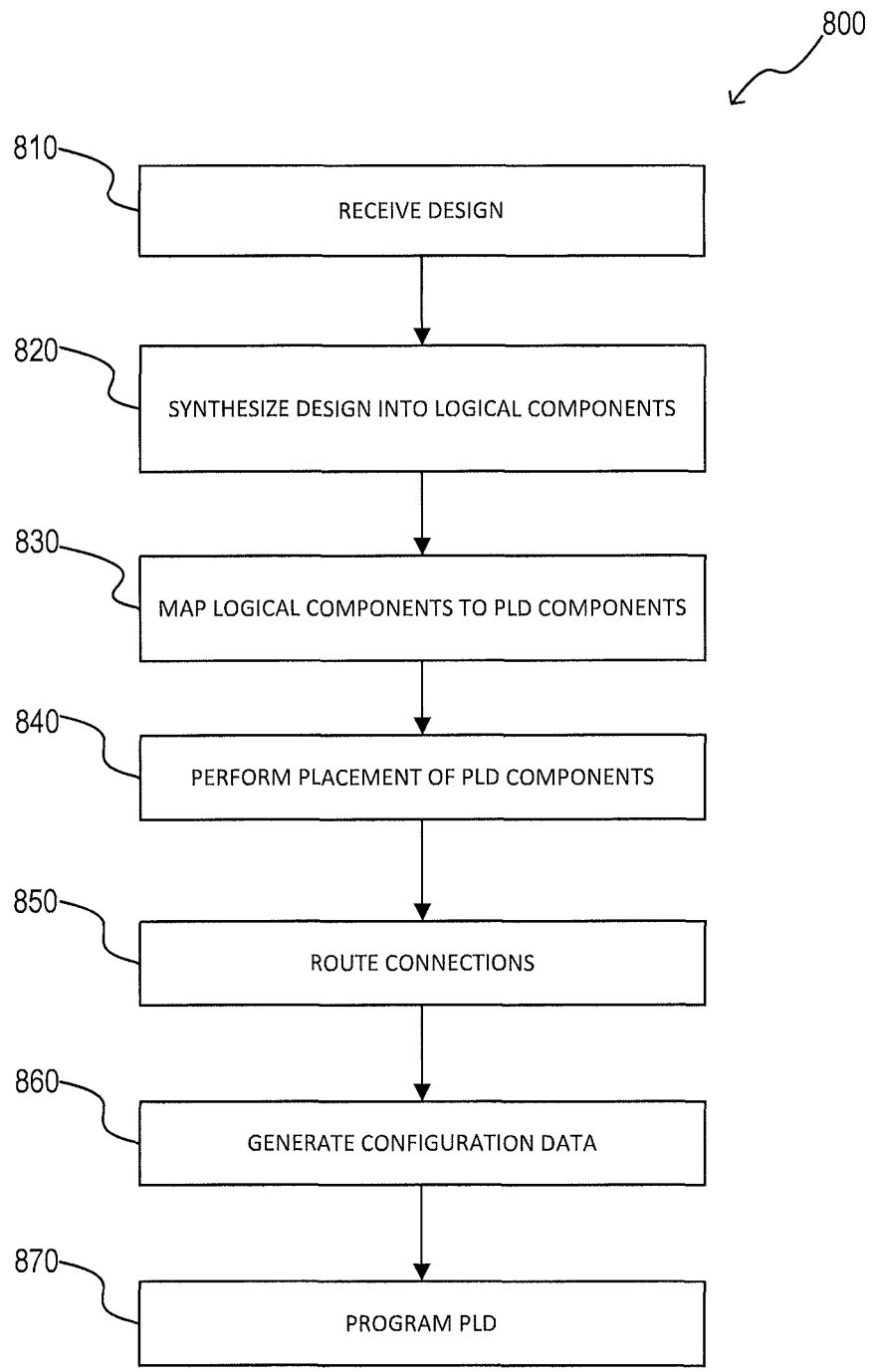
FIG. 8 illustrates a flowchart of a design process for a PLD in accordance with an embodiment of the disclosure.

Turning now to FIG. 8, a design process 800 for a PLD (e.g., PLD 100) is illustrated in accordance with an embodiment of the disclosure. For example, process 800 may include operations to hierarchically slice a logical memory in a user design and to map it onto one or more EBRs (e.g., EBRs 106/206) and/or other PLD resources to implement the logical memory in PLD 100. In some embodiments, process 800 of FIG. 8 may be performed by system 130 running Lattice Diamond™ software, available from Lattice Semiconductor Corporation of Portland, Oreg., to configure PLD 100. In some embodiments, the various files and information referenced in FIG. 8 may be stored, for example, in one or more databases and/or other data structures in memory 134, machine readable medium 136, and/or otherwise.

In block 810, system 130 receives a user design that specifies the desired functionality of PLD 100. For example, the user may interact with system 130 (e.g., through user input device 137 and HDL code representing the design) to identify various features of the user design (e.g., high level logic operations, memory operations, hardware configurations, and/or other features). In some embodiments, the user design may be provided in a RTL description (e.g., a gate level description). In some embodiments, at least a portion of the user design may be specified by the user through a module generator (e.g., parameterizable modules, libraries, templates and/or schematics) or other design tools that aid the user in creating design for PLD 100. In some embodiments, system 130 may perform one or more rule checks to confirm that the user design describes a valid configuration of PLD 100. For example, system 130 may reject invalid configurations and/or request the user to provide new design information as appropriate.

In block 820, system 130 synthesizes the user design to create a netlist (e.g., a synthesized RTL description) identifying an abstract implementation of the user design as a plurality of logical components (e.g., also referred to as netlist components). In some embodiments, the netlist may be stored in Electronic Design Interchange Format (EDIF) in a Native Generic Database (NGD) file.

In various embodiments, synthesizing the user design into a netlist in block 820 includes identifying and/or synthesizing, from the user design, instances of logical memory (e.g., logical memory 400/500) to be implemented by PLD resources as part of the user design. Such instances may be identified (e.g., inferred), synthesized, and/or otherwise provided from HDL code, a RTL description, a module generator output, or other description of a portion of the design specifying a behavior and/or structure of a RAM, FIFO, shift registers, or other types of memory to be implemented by PLD resources as part of the user design as would be understood by one skilled in the art. Synthesized logical memory may include accompanying logic functions (e.g., to be implemented in PLBs 104) as would be understood by one skilled in the art to carry out address decoding, output multiplexing, and/or memory line combining, for example.

In block 830, system 130 performs a mapping process that identifies components of PLD 100 that may be used to implement the user design. In this regard, system 130 may map the synthesized netlist (e.g., stored in block 820) to various types of components provided by PLD 100 (e.g., EBRs 106/206, logic blocks 104, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in block 820 to produce a netlist that is mapped to PLD components.

In various embodiments, the logical memory identified and/or synthesized in block 820 may be sliced and mapped onto one or more EBRs 106/206 and/or other portions of PLD 100 as described above with reference to FIGS. 5A-5C, 6A-6B, and 7. Thus, after block 830, the identified and/or synthesized logical memory may, for example, be hierarchically sliced and mapped onto EBRs 106/206 configured in a selected combination of depth-width configurations, which may beneficially improve memory area efficiency in implementing the logical memory in PLD 100 as discussed herein.

In block 840, system 130 performs a placement process to assign the mapped netlist components to particular physical components residing at specific physical locations of the PLD 100 (e.g., assigned to particular PLBs 104, EBRs 106/206, and/or other physical components of PLD 100), and thus determine a layout for the PLD 100. In some embodiments, the placement may be performed on one or more previously-stored NCD files, with the placement results stored as another physical design file.

In block 850, system 130 performs a routing process to route connections (e.g., using routing resources 180) among the components of PLD 100 based on the placement layout determined in block 840 to realize the physical interconnections among the placed PLD components. In some embodiments, the routing may be performed on one or more previously-stored NCD files, with the routing results stored as another physical design file.

Thus, after block 850, one or more physical design files may be provided which specify the user design after it has been synthesized, mapped (including one or more logical memories mapped to EBRs 106/206 and/or other PLD components according to embodiments of the disclosure), placed, and routed for PLD 100 (e.g., by combining the results of the corresponding previous operations). In block 860, system 130 generates configuration data for the synthesized, mapped, placed, and routed user design.

In block 870, system 130 configures PLD 100 with the configuration data by, for example, loading a configuration data bitstream into PLD 100 over connection 140. Thus, for example, PLD 100 loaded with the configuration data may implement a logical memory in a user design using one or more EBRs 106/206 configured in a particular EBR configuration for one portion (e.g., main area 550A/550B/550C) of the logical memory and one or more other EBRs 106/206 configured in one or more EBR configurations for another portion (e.g., subarea 550A/550B/550C) of the logical memory in a hierarchical fashion as discussed above with reference to FIGS. 5A-5C, 6A-6B, and 7.

Figure 9:
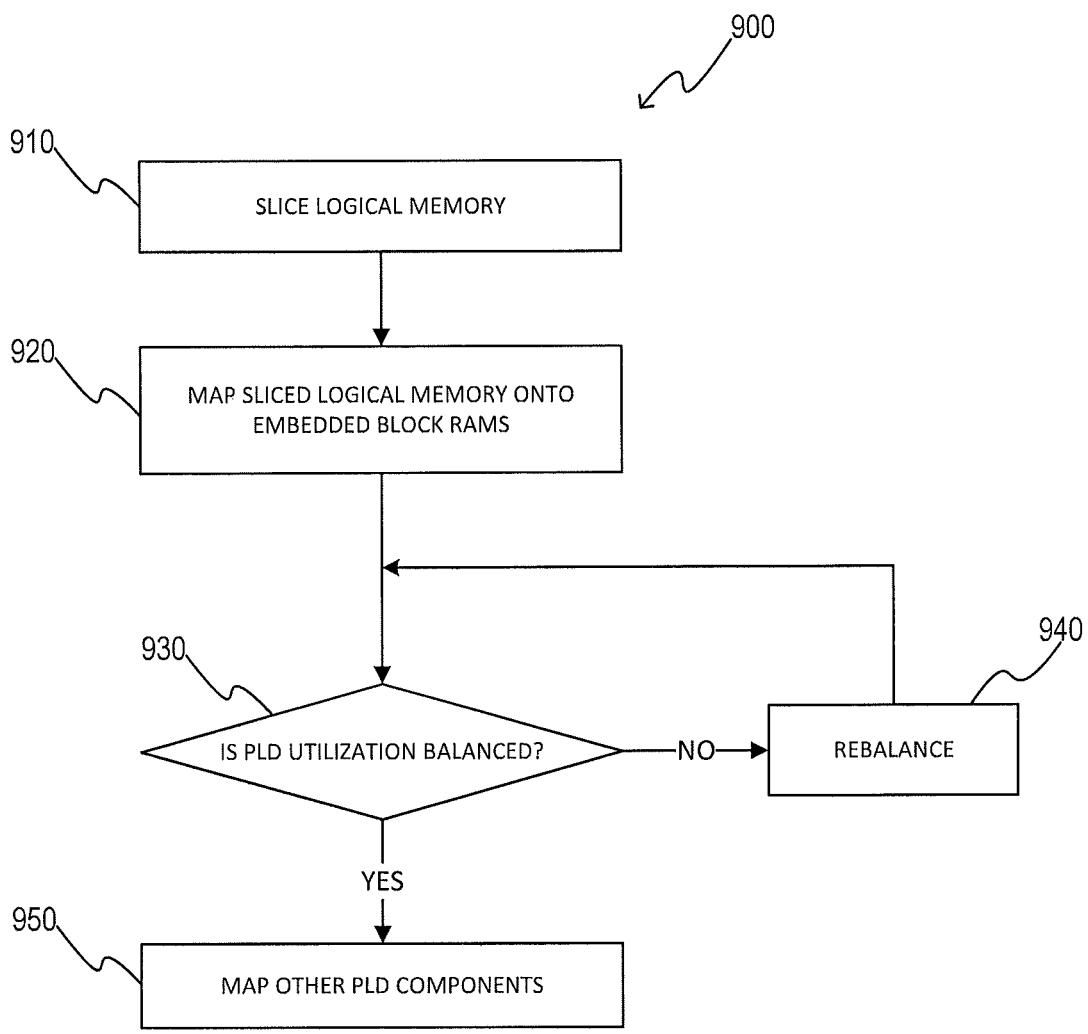
FIG. 9 illustrates a flowchart of a process for mapping a logical memory in accordance with an embodiment of the disclosure.

FIG. 9 illustrates a flowchart of a process 900 to slice and map a logical memory (e.g., logical memory 400/500) in accordance with an embodiment of the disclosure. For example, in various embodiments, process 900 may be performed as part of block 830 and/or block 820 of design process 800. While process 900 includes operations to slice and map a logical memory, process 900 may herein be referred to generally as a mapping process for a logical memory, and the expression "map" or "mapping" as used herein may be understood in some contexts to include slicing of all or portions of a logical memory as discussed herein according to various embodiments.

Figure 10:
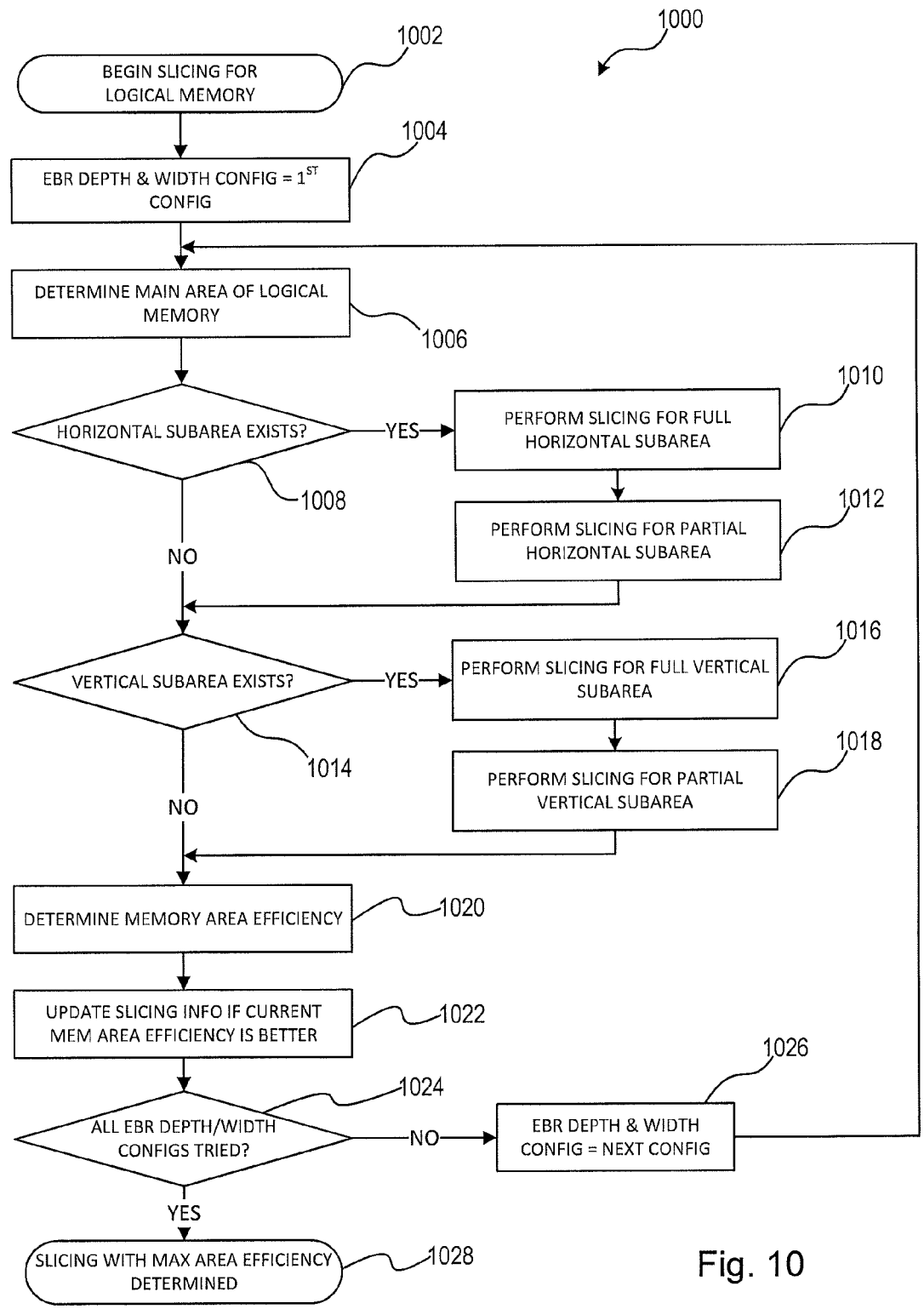
FIG. 10 illustrates a flowchart of a hierarchical slicing process that may be performed as part of the process of FIG. 9, in accordance with an embodiment of the disclosure.

In block 910, a logical memory identified and/or synthesized from the user design is sliced by the hierarchical slicing techniques described above with reference to FIGS. 5A-5C, 6A-6B, and 7 for one or more embodiments of the disclosure. As a specific example, a flowchart of a hierarchical slicing process 1000 that may be carried out in block 910 for one or more embodiments is illustrated in FIG. 10. Referring also to FIG. 10, in block 1002, slicing begins for a logical memory (e.g., a logical memory identified and/or synthesized in block 820 of design process 800). As briefly discussed above, a logical memory (e.g., logical memory 400/500) may be described logically or abstractly based on its features, including its depth and width. Thus, for example, block 1002 may include receiving information including the depth and width of the logical memory to be sliced to begin hierarchical slicing process 1000.

As discussed above for FIGS. 5A-5C and 6A-6B, division of the logical memory into main area 550A/550B/550C and subarea 552A/552B/552C may be repeated for a number of different EBR configurations. Thus, in block 1004, a first one of available EBR configurations associated with EBR 106/206 is set as the EBR configuration (e.g., including a depth and a width of EBR 106/206) to start such repetitions (e.g., iterations) for determining a main area and a subarea. As also discussed above, hierarchical slicing process 1000 may try (e.g., repeat for) all or some of the available configurations provided by EBR 106/206 depending on embodiments.

In block 1006, a main area (e.g., main area 550A/550B/550C) of the logical memory may be determined with respect to the currently selected EBR configuration. For example, as discussed above for FIGS. 5A-5C, the main area may be determined as a portion of the logical memory where one or more EBRs 106/206 can be mapped in their entireties for the currently selected EBR configuration. In case there is no whole EBR 106/206 that can fit within the logical memory with the selected EBR configuration, the main area may be determined to correspond to one EBR 106/206 to continue hierarchical slicing process 1000, according to some embodiments.

In block 1008, it may be determined whether the remaining portion of the logical memory comprises a horizontal subarea (e.g., subarea 552A/660A/660B) after determining the portion corresponding to the main area in block 1006. As illustrated above in FIGS. 5A, 5C, 6A, and 6B, in case the main area does not extend over the entire depth of the logical memory, the remaining portion may comprise a horizontal subarea (e.g., horizontal subarea 552A, full horizontal subarea 660A, or partial horizontal subarea 660B). Thus, for example, in some embodiments, block 1008 may involve checking whether the main area determined in block 1006 extends over the entire depth of the logical memory or not. If a horizontal subarea exits, process 1000 may flow to block 1010. If not, process 1000 may flow to block 1014.

In blocks 1010, after it is determined that a horizontal subarea exists, slicing is performed for the entire width of the horizontal subarea (the full horizontal subarea) in the same manner as for the logical memory. Thus, in block 1010, a new instance of slicing process 1000 may be started which depends from the current instance of process 1000, with the full horizontal subarea for the selected EBR configuration being treated as a logical memory to be sliced by the dependent/child instance of slicing process 1000.

In some embodiments, slicing is additionally performed in block 1012 for a partial width of the horizontal subarea corresponding to the width of the main area (the partial horizontal subarea) in the same manner as for the logical memory. By trying both the full horizontal subarea and the partial horizontal subarea, hierarchical slicing process 1000 can address two ways of dividing an L-shaped subarea as illustrated above with respect to FIGS. 6A and 6B. In other words, hierarchical slicing process 1000 according to some embodiments may try and compare two cases of division (e.g., comparing between full horizontal subarea 660A+partial vertical subarea 662A and partial horizontal subarea 660B+full vertical subarea 662B) of an L-shaped subarea to find more efficient slicing of the L-shaped subarea if one exists. In other embodiments, only block 1010, only block 1012, or both blocks 1010 and 1012 may be carried out depending on the shape of the subarea (e.g., whether it is horizontal or L-shaped) and/or depending on whether only one way of dividing an L-shaped subarea is desired.

In block 1014, it may be determined whether the remaining portion of the logical memory comprises a vertical subarea (e.g., subarea 552B/662A/662B). As illustrated above in FIGS. 5B, 5C, 6A, and 6B, in case the main area does not extend over the entire width of the logical memory, the remaining portion may comprise a vertical subarea (e.g., vertical subarea 552B, partial vertical subarea 662A, or full vertical subarea 662B). For example, similar to block 1008, block 1014 may involve checking whether the main area determined in block 1006 extends over the entire width of the logical memory or not according to some embodiments. If a vertical subarea exits, process 1000 may flow to block 1016. If not, process 1000 may flow to block 1020.

In block 1016, similar to block 1010 for the horizontal subarea, slicing is performed for the entire depth of the vertical subarea (the full horizontal area) in the same manner as for the logical memory. In some embodiments, similar to block 1012 for the horizontal subarea, slicing is performed in block 1018 for a partial depth of the vertical subarea corresponding to the depth of the main area (the partial horizontal subarea) in the same manner as for the logical memory. As discussed above for blocks 1010 and 1012, two ways of dividing an L-shaped subarea can be addressed in embodiments that carry out both blocks 1016 and 1018. In other embodiments, only block 1016, only block 1018, or both blocks 1016 and 1018 may be carried out depending on the shape of the subarea (e.g., whether it is vertical or L-shaped) and/or depending on whether only one way of dividing an L-shaped subarea is desired.

Thus, after block 1016, a dependent/child instance(s) of slicing process 1000 is started for a full horizontal subarea and/or a partial horizontal subarea if a horizontal subarea exists, and a dependent/child instance(s) of slicing process 1000 is started for a full vertical subarea and/or a partial vertical subarea if a vertical subarea exists, according to various embodiments. In this way, slicing process 1000 according to one or more embodiments may continue hierarchically with subareas as discussed above for FIGS. 5A-5C and 6A-6B. Further in this regard, hierarchical slicing process 1000 may be implemented using a recursive process (e.g., recursively performing slicing process 1000 for subareas until no subarea exists), starting with the logical memory at the root process.

In block 1020, an efficiency metric for the currently selected EBR configuration may be calculated or otherwise determined. In various embodiments, the efficiency metric may be related to or indicative of the resulting PLD resource requirement when the logical memory is sliced and mapped according to the currently selected EBR configuration, including the hierarchical slicing of the dependent/child subareas according to the combination of EBR configurations for the dependent/child subareas.

For example, in some embodiments, the efficiency metric may be based at least in part on the size of the logical memory relative to the aggregate physical memory size of all EBRs 106/206 required to implement the logical memory if sliced and mapped according to the currently selected hierarchical combination of EBR configurations. In this regard, the efficiency metric determined in such embodiments may also be referred to as a memory area efficiency metric or simply memory area efficiency, and may be expressed in terms of the ratio of the logical memory size to the aggregate physical memory size of all EBRs required to implement the logical memory. Since both the size of the logical memory and the physical size of each EBR 106/206 is known, the memory area efficiency may be determined in block 1020 simply by determining the number of EBRs 106/206 required to implement the logical memory sliced according to the currently selected hierarchical combination of EBR configurations.

In some embodiments, the memory area efficiency metric may also take into account the logic area of supporting logic, such as for implementing additional logic functions to implement address decoding and output multiplexing that may be required for implementing the logical memory according to the currently selected hierarchical combination of EBR configurations. This is because the size of the supporting logic may not be negligible in certain situations, such as when the size of the logical memory is relatively large.

To take into account the size of supporting logic, the size of address decoders and output multiplexers may be normalized to a size of memory in various embodiments. In some embodiments, the size requirement of each 4-input LUT (LUT-4) required to implement address decoders or output multiplexers may be normalized to 16 bits of memory. Then, in one or more embodiments, the normalized size of address decoder logic may be expressed as $2^{\wedge}$(MAX_DEPTH_CASCADING-BUILT_IN_DECODER_SIZE)×16 bits, where "MAX_DEPTH_CASCADING" represents the maximum levels of EBR row cascading to implement the logical memory and "BUILT_IN_DECODER_SIZE" represent the number of address bits in a built-in address decoder of EBRs 106/206. MAX_DEPTH_CASCADING in other words may be the maximum of the required level of row cascading for all EBR columns mapped to the logical memory, where the required level of EBR row cascading (represented as "DEPTH_CASCADING") corresponding to each bit column of the logical memory (represented as "memory_column") may be expressed as DEPTH_CASCADING[memory_column]= [log 2((depth of the logical memory)/(depth of EBR configuration)]. As for output multiplexers, the normalized area of output multiplexer logic may be expressed as $16 \times \Sigma(2^{\wedge}$DEPTH_CASCADING[memory_column]−1), according to one or more embodiments.

As non-limiting, illustrative examples of a memory area efficiency determination that takes into accounting the supporting logic (e.g., memory area efficiency=logical memory size/(aggregate EBR size+normalized area of supporting logic)), the memory area efficiency of the mapping examples above in FIGS. 4A and 4B obtained by conventional techniques and the mapping example in FIG. 7 obtained by the techniques of one or more embodiments of the disclosure may be determined and compared as follows (assuming BUILT_IN_DECODER_SIZE=3, and thus no area is taken up by additional address decoders in these examples):

Conventional mapping result in FIG. 4A:

memory area efficiency=52$K$/(18$K$×4)=72.2%;

Conventional mapping result in FIG. 4C:

memory area efficiency=52$K$/(18$K$×4+16×13)=72.0%; and

Hierarchical slicing and mapping result in FIG. 7:

memory area efficiency=52$K$/(18$K$×3+16×9)=96.0%.

Thus, it can be seen that the memory area efficiency for the example logical memory mapping by the hierarchical slicing and mapping techniques according to embodiments of the disclosure is much higher (e.g., utilizes EBRs 106/206 and supporting PLBs 104 more efficiently) than the examples obtained by conventional techniques.

Referring again to block 1020, in embodiments in which the efficiency metric comprises a memory area efficiency metric, block 1020 may comprise determining the aggregate size of EBRs 106/206 to be mapped to the main area, the aggregate size of EBRs 106/206 to be mapped to the subarea, and the size of the supporting logic. In various embodiments, the size (e.g., the normalized size) of the supporting logic may be determined as described in the preceding paragraphs, for example. In various embodiments, the aggregate size of EBRs 106/206 to be mapped to the main area may be determined based on the number of EBRs 106/206 that fit within the main area multiplied by the size of each EBR 106/206.

In various embodiments, the aggregate size of EBRs 106/206 to be mapped by the subarea may be determined by the dependent/child instance of slicing process 1000 for hierarchically slicing the subarea (e.g., by a recursive process according to some embodiments) discussed above for blocks 1010, 1012, 1016, and 1018. Because instances of the same slicing process 1000 is performed for the dependent subareas in the hierarchy, the results of the dependent/child instances of slicing process 1000 may each comprise hierarchical slicing of the respective subarea that produces the best memory area efficiency (e.g. the smallest combination of aggregate EBR area+supporting logic area) for the subarea. Thus, the smallest size (e.g., the smallest area) for the subarea according to the hierarchical slicing techniques of the disclosure may be produced by the dependent/child instance of slicing process 1000 in blocks 1010, 1012, 1016, and 1018.

As discussed above for some embodiments, if the subarea is L-shaped (e.g., both a horizontal and vertical subareas exist as determined in blocks 1008 and 1014), two ways of dividing the L-shaped subarea (e.g., (full horizontal+partial vertical) and (partial horizontal+full vertical)) may be tried. In such embodiments, a determination of the aggregate size of EBRs 106/206 to be mapped to the subarea may include comparing the sizes the aggregate size of EBRs 106/206 obtained for the two ways of dividing the L-shaped subarea (e.g., comparing the aggregate subarea size for full horizontal+partial vertical, with the aggregate subarea size for partial horizontal+full vertical), and selecting the smaller of the two as the aggregate size of EBRs 106/206 for the subarea.

Therefore, for embodiments in which the efficiency metric includes memory area efficiency, block 1020 comprise determining the aggregate size of the PLD resources (e.g., EBRs 106/206 required for the main area and the subarea, plus the supporting logic area) required to implement the logical memory with the currently selected hierarchical combination of EBR configurations. As briefly discussed above, the ratio of the logical memory size to the physical PLD resource size need not be calculated explicitly, since the logical memory size is known and constant for slicing process 1000.

In block 1022, the efficiency metric (e.g., the memory area efficiency) determined in block 1020 for the currently selected EBR configuration is compared against a previously stored best efficiency metric. If the efficiency metric determined for the currently selected EBR configuration is better, the currently selected EBR configuration (e.g., including hierarchical combination of EBR configurations for the subareas in the hierarchy), the corresponding slicing of the main area (e.g., in number of rows and columns of EBRs 106/206), and the corresponding efficiency metric are stored, for example, as new best slicing, in one or more embodiments. In other words, information relating to slicing (or simply referred to as slicing information) is updated with the currently selected EBR configuration if the currently selected EBR configuration yields better slicing according to the efficiency metric.

In this regard, according to some embodiments, the information relating to slicing may comprise a binary tree structure where each node has slicing information for the horizontal subarea (as determined in block 1010 or 1012) as one child and/or slicing information for the vertical subarea (as determined in block 1016 or 1018) as the other child, with slicing information for the logical memory (e.g., a logical memory identified and/or synthesized in block 820 of design process 800) being the root. As may also be appreciated, the previously stored best efficiency metric may be initialized (e.g., initialized to zero) in the beginning of slicing process

1000 (e.g., in block 1002), since there may not be a previously stored best before execution of slicing process 1000.

In block 1024, it is checked whether there is any EBR configuration remaining to be tried for division of the logical memory into a main area and a subarea. As discussed above for block 1004, hierarchical slicing process 1000 may try (e.g., repeat for) all or a selected ones of the available configurations provided by EBR 106/206 depending on embodiments. If there is an EBR configuration not yet tried, hierarchical slicing process 1000 may continue to block 1026 to select one from EBR configuration(s) remaining to be tried, and repeat blocks 1006 through 1024 with the newly selected EBR configuration.

If all EBR configurations set to be tried have been tried, hierarchical slicing process 1000 ends in block 1028. The hierarchical combination of EBR configurations (e.g., represented as a binary tree) stored in the slicing information may then be the one that yields the best slicing according to the efficiency metric.

Returning to FIG. 9, after the logical memory is sliced in block 910, for example by performing one or more embodiments of hierarchical slicing process 1000 of FIG. 10 to yield the best hierarchical slicing according to an efficiency metric, process 900 continues to block 920 to map the logical memory to EBRs 106/206 according to the slicing determined in block 910.

Figure 11:
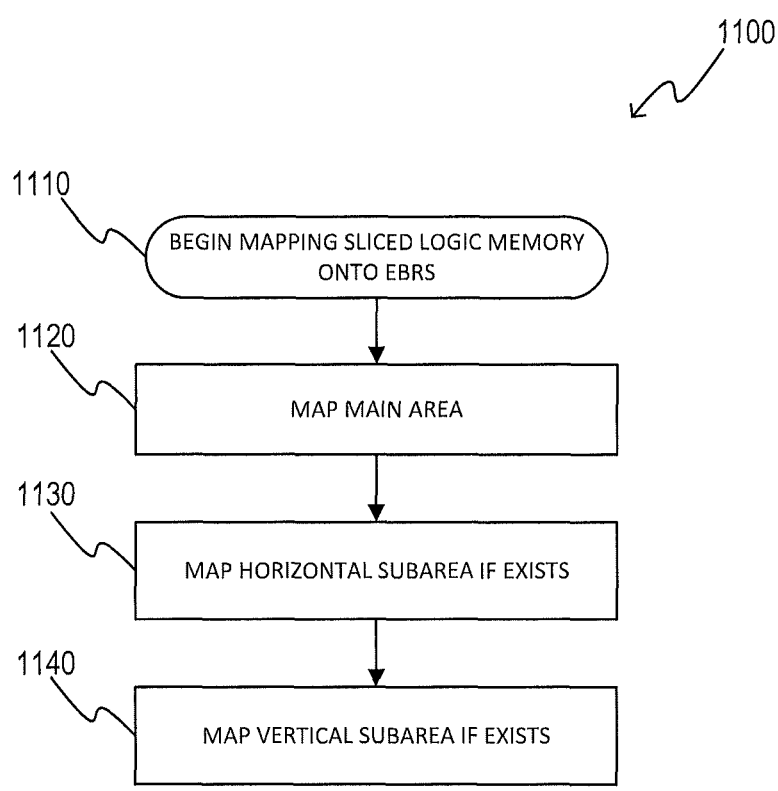
FIG. 11 illustrates a flowchart of a mapping process that may be performed as part of the process of FIG. 9, in accordance with an embodiment of the disclosure.

For example, FIG. 11 illustrates a flowchart of a mapping process 1100 that may be performed as part of block 920, in accordance with an embodiment of the disclosure. Mapping process 1100 may begin in block 1110, based on the slicing information (e.g., hierarchically including slicing of a horizontal subarea and/or a vertical subarea) determined by embodiments of hierarchical slicing process 1000 of FIG. 10, for example.

In block 1120, the main area of the logical memory is mapped to one or more EBRs 106/206. For example, in one or more embodiments, the main area of the logical memory may be mapped onto an appropriate number EBRs 106/206 in corresponding positions based on the EBR configuration and the number of main area EBR rows and columns stored as part of the slicing information.

In block 1130, if a horizontal subarea exists as a result of the slicing in block 910 of FIG. 9, the horizontal subarea of the logical memory is mapped to one or more EBRs 106/206. The mapping of the horizontal subarea may be performed in the same manner as for the logical memory. In this regard, in one or more embodiments, the mapping of the horizontal subarea may be performed recursively with a new dependent/child instance of mapping process 1100. Thus, for example, the mapping of the horizontal subarea may be performed hierarchically, corresponding to the hierarchical slicing determined by hierarchical slicing process 1000.

In block 1140, if a vertical subarea exists as a result of the slicing in block 910 of FIG. 9, the vertical subarea of the logical memory is mapped to one or more EBRs 106/206. The mapping of the vertical subarea may also be performed in the same manner as for the logical memory. In one or more embodiments, for example, the mapping of the vertical subarea may be performed recursively with a new dependent/child instance of mapping process 1100, similar to the mapping of the horizontal subarea in block 1130.

Thus, after mapping process 1100 is performed according to one or more embodiments, the logical memory may be mapped to one or more EBRs 106/206 based on the slicing determined in block 910 of FIG. 9 (e.g., by performing hierarchical slicing process 1000 according to one or more embodiments). For example, in one or more embodiments, the one or more EBRs 106/206, onto which the logical memory is mapped, may be included (e.g., installed) as EBR components in a mapped netlist of PLD components for implementing the user design, as a result of performing mapping process 1100.

Returning again to FIG. 9, after the logical memory is mapped in block 920, process 900 continues to block 930 to determine (e.g., check) whether the utilization of PLD components is balanced or not. In one or more embodiments, this may involve checking whether the number of EBRs 106/206 mapped to implement the logical memory is excessive or not according to a PLD resource utilization metric. For example, the number of EBRs 106/206 mapped to implement the logical memory may be compared against a predetermined threshold to determine whether the mapping of EBRs 106/206 in block 920 results in balanced utilization of EBRs 106/206 and/or other PLD resources. The predetermined threshold may, for example, be based on the number of available ERBs 106/206 in PLD 100 or other criteria (e.g., for reserving a certain number of EBRs 106/206 to allow for implementing other components of the user design).

In some embodiments, determining whether the utilization of PLD components is balanced or not may alternatively or additionally be based on the utilization of PLBs 104 in implementing the user design. For example, if the utilization of PLBs 104 is comparatively lower than the utilization of EBRs 106/206, or if the utilization of PLBs 104 is lower than a predetermined threshold, the utilization of PLD components may be determined to be unbalanced.

If the mapping of EBRs 106/206 would result in over-utilization of EBRs 106/206 (e.g., too many EBRs 106/206 need to be mapped to implement the logical memory) or otherwise results in unbalanced utilization, process 900 continues to block 940 to rebalance the mapping. For example, in block 940, one or more portions of the logical memory mapped to one or more EBRs 106/206 may instead be mapped to one or more PLBs 104. As discussed above with reference to FIG. 3, PLBs 104 can be configured to function as a memory (e.g., as a distributed memory) in one or more implementations of PLD 100, and thus may be used to replace EBRs 106/206 in case rebalancing is needed. Thus, for example, rebalancing in this manner may lead to more balanced utilization between EBRs 106/206 and PLBs 104.

In various embodiments, rebalancing of the mapping in block 940 may include selecting which mapped EBR or EBRs to replace with PLBs 104. For example, mapped EBR or EBRs may be selected for replacement according to an efficiency metric, such as a memory area efficiency metric, to replace those mapped EBR(s) that have low memory area efficiency. For one or more embodiments in which the slicing and mapping in blocks 910 and 920 produce hierarchical slicing and mapping information such as a binary tree structure as discussed above for some embodiments of processes 1000 and 1100, the selecting of one or more mapped EBRs to replace may include traversing the binary tree of mapped EBRs (e.g., according to a depth-first order traversal such as a pre-order traversal) and creating a sorted list of mapped EBR(s) with respect to the efficiency metric, such that one or more mapped EBRs can be quickly selected from the sorted list (e.g., from the top of the list if sorted in ascending order and from the bottom of the list if sorted in descending order).

After rebalancing (e.g., selecting one or more mapped EBRs and replacing with corresponding PLBs configured as distributed memory) in block 940, process 900 according to some embodiments may flow back to block 930 to repeat checking whether the mapping is balanced or not and rebalancing until the mapping is determined to be balanced according to the predetermined threshold or other criteria. Once the mapping is determined to be balanced, process 900 may map other PLD components in block 950 if desired or needed.

Therefore, by processes 800, 900, 1000, and 1100 according to various embodiments of the disclosure, a logical memory in a user design for PLD 100 may be hierarchically sliced and mapped to produce an area-efficient implementation of the logical memory using EBRs 106/206 and PLBs 104, such that PLD 100 configured with the user design may require fewer EBRs 106/206 or other PLD resources to implement the logical memory than would be possible with conventional mapping techniques. Configuration data including the EBR configurations and mapping generated by processes 800, 900, 1000, and 1100 according to various embodiments of the disclosure may be stored in configuration memory 142 embedded within and/or communicatively coupled to PLD 100, and may be provided from configuration memory 142 to PLD 100 (e.g., when PLD 100 is powered on or otherwise initialized) to configure and map EBRs 106/206 and PLBs 104 for implementing the logical memory in such an area-efficient manner.

For example, PLD 100 configured with the user design according to one or more embodiments of the disclosure may include one or more EBRs 106/206 configured in one EBR configuration and implementing one portion (e.g., the main area) of the logical memory, and another one or more EBRs 106/206 configured in another EBR configuration and implementing another portion (e.g., the main area of a dependent subarea) of the logical memory. Such combining of EBRs 106/206 in different EBR configurations for different portions of the logical memory follows the hierarchical slicing of the logical memory according to various embodiments of the disclosure, continuing hierarchically as needed to fully implement the logical memory in PLD 100. In embodiments in which rebalancing may be performed, PLD 100 configured with the user design may include one or more PLBs 104 configured as memory components (e.g., distributed memories) and implementing one or more portions of the logical memory, for example, where an implementation by EBR 106/206 may not be possible (e.g., because no more EBR 106/206 is available in PLD 100 to implement the logical memory) or result in inefficiency according to an efficiency metric.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
   determining, by one or more processors, a main area of a logical memory in a design for a programmable logic device (PLD), the main area being a portion of the logical memory that can be fully mapped to a first set of embedded block RAMs (EBRs) configured in a first depth-width configuration;
   mapping the main area to the first set of EBRs;
   mapping a subarea of the logical memory to a second set of EBRs configured in one or more depth-width configurations different from the first depth-width configuration, the subarea being a remainder of the logical memory excluding the main area; and
   storing configuration data for the PLD, the configuration data identifying the main area mapped to the first set of EBRs and the subarea mapped to the second set of EBRs.

2. The computer-implemented method of claim 1, further comprising selecting the first depth-width configuration based on a memory area efficiency metric comprising an aggregate size of the first set of EBRs to be mapped to the main area and the second set of EBRs to be mapped to the subarea to implement the logical memory.

3. The computer-implemented method of claim 2, wherein the memory area efficiency metric further comprises a size of one or more address decoders and/or one or more output multiplexers for implementing the logical memory with the first and second sets of EBRs.

4. The computer-implemented method of claim 2, wherein the determining of the main area is responsive to the selecting of the first depth-width configuration.

5. The computer-implemented method of claim 1, wherein the mapping of the subarea of the logical memory comprises:
   determining a dependent main area of the subarea, the dependent main area being a portion of the subarea that can be fully mapped to those of the second set of EBRs that are configured in a second depth-width configuration;
   mapping the dependent main area to those of the second set of EBRs that are configured in the second depth-width configuration; and
   mapping a dependent subarea of the subarea to those of the second set of EBRs that are configured in one or more depth-width configurations different from the first and second depth-width configurations, the dependent subarea being a remainder of the subarea excluding the dependent main area.

6. The computer-implemented method of claim 5, further comprising selecting the second depth-width configuration based on a memory area efficiency metric comprising an aggregate size of the second set of EBRs to be mapped to implement the subarea of the logical memory.

7. The computer-implemented method of claim 1, wherein the method is performed recursively with the subarea taking the place of the logical memory at each level of recursion.

8. The computer-implemented method of claim 1, wherein:
the subarea comprises an L-shaped subarea; and
the mapping of the subarea comprises determining a first division of the L-shaped subarea into a full horizontal subarea and a partial vertical subarea and/or a second division of the L-shaped subarea into a partial horizontal subarea and a full vertical subarea.

9. The computer-implemented method of claim 8, wherein the mapping of the subarea comprises determining the first division and the second division, and wherein the mapping of the subarea further comprises:
selecting between the first division and the second division based on a memory area efficiency metric comprising an aggregate size of the second set of EBRs to be mapped to implement the subarea of the logical memory; and
mapping the subarea according to the selected one of the first division or second division.

10. The computer-implemented method of claim 1, further comprising:
determining that a number of the first set of EBRs and the second set of EBRs mapped to implement the logical memory is excessive according to a PLD resource utilization metric; and
replacing a selected one EBR of the first set of EBRs or second set of EBRs with a programmable logic block (PLB) configured as a memory.

11. The computer-implemented method of claim 10, wherein the determining that the number of the first set of EBRs and second set of EBRs mapped to implement the logical memory is excessive comprises comparing the number of the first set of EBRs and second set of EBRs mapped to implement the logical memory against a number of EBRs available in the PLD.

12. A non-transitory machine-readable medium storing a plurality of machine-readable instructions which, when executed by one or more processors of a computer system, are adapted to cause the computer system to perform the method of claim 1.

13. A system comprising:
a programmable logic device (PLD) comprising a plurality of embedded block RAMs (EBRs) each configurable in one of a plurality of depth-width configurations;
a configuration memory storing configuration data for the PLD to implement a design that includes a logical memory;
wherein the configuration data configures a first subset of the EBRs in a first depth-width configuration and fully maps a first portion of the logical memory to the first subset of the EBRs; and
wherein the configuration data configures a second subset of the EBRs in one or more depth-width configurations different from the first depth-width configuration and maps a second portion of the logical memory to the second subset of the EBRs.

14. The system of claim 13, wherein the configuration memory comprises a non-volatile memory embedded in the PLD.

15. The system of claim 13, wherein the configuration memory comprises a non-volatile memory communicatively coupled to the PLD.

16. The system of claim 13, wherein the second portion of the logical memory is a remainder of the logical memory excluding the first portion.

17. The system of claim 13, wherein:
the PLD further comprises a plurality of programmable logic blocks (PLBs) comprising look-up tables (LUTs) and configurable to provide logic functionalities or distributed memory functionalities; and
the configuration data configures one or more of the PLBs as distributed memories and maps a third portion of the logical memory to the one or more of the PLBs.

18. The system of claim 13, wherein:
the PLD further comprises a plurality of programmable logic blocks (PLBs) comprising look-up tables (LUTs) and configurable to provide logic functionalities; and
the configuration data configures one or more of the PLBs to operate as an address decoder and/or an output multiplexer to implement the logical memory with the first and second subsets of the EBRs.

19. The system of claim 13, wherein the respective depth-width configurations for the first and second subsets of the EBRs are selected based on a memory area efficiency metric comprising an aggregate size of the first and second subsets of the EBRs mapped to implement the logical memory.

20. A programmable logic device (PLD) configured with a design including a logical memory, the PLD comprising:
a plurality of embedded block RAMs (EBRs) configurable according to a plurality of depth-width configurations;
wherein a first subset of the EBRs is configured in a first depth-width configuration and fully mapped by a portion of the logical memory; and
wherein a second subset of the EBRs is configured in one or more depth-width configurations different from the first depth-width configuration and mapped by a remainder of the logical memory excluding the portion mapped to the first subset of the EBRs.

* * * * *